United States Patent
Li et al.

(10) Patent No.: US 12,271,807 B2
(45) Date of Patent: Apr. 8, 2025

(54) CONVOLUTIONAL NEURAL NETWORK COMPUTING METHOD AND SYSTEM BASED ON WEIGHT KNEADING

(71) Applicant: Institute of Computing Technology, Chinese Academy of Sciences, Beijing (CN)

(72) Inventors: Xiaowei Li, Beijing (CN); Xin Wei, Beijing (CN); Hang Lu, Beijing (CN)

(73) Assignee: Institute of Computing Technology, Chinese Academy of Sciences, Beijing (CN)

( * ) Notice: Subject to any disclaimer, the term of this patent is extended or adjusted under 35 U.S.C. 154(b) by 1056 days.

(21) Appl. No.: 17/250,892

(22) PCT Filed: May 21, 2019

(86) PCT No.: PCT/CN2019/087767
§ 371 (c)(1),
(2) Date: Mar. 19, 2021

(87) PCT Pub. No.: WO2020/057160
PCT Pub. Date: Mar. 26, 2020

(65) Prior Publication Data
US 2021/0350214 A1 Nov. 11, 2021

(30) Foreign Application Priority Data
Sep. 20, 2018 (CN) .......................... 201811100309.2

(51) Int. Cl.
G06N 3/048 (2023.01)
G06F 5/01 (2006.01)
(Continued)

(52) U.S. Cl.
CPC ............... G06N 3/048 (2023.01); G06F 5/01 (2013.01); G06F 7/50 (2013.01); G06F 7/5443 (2013.01);
(Continued)

(58) Field of Classification Search
CPC .......... G06N 3/048; G06N 3/04; G06N 3/063; G06N 3/045; G06N 3/08; G06N 3/082;
(Continued)

(56) References Cited

U.S. PATENT DOCUMENTS

2021/0004668 A1\* 1/2021 Moshovos ............. G06N 3/045

FOREIGN PATENT DOCUMENTS

| CN | 103679185 A | 3/2014 |
|---|---|---|
| CN | 107086910 A | 8/2017 |
| CN | 109543816 S | 3/2019 |

OTHER PUBLICATIONS

US Office Action, as issued in connection with U.S. Appl. No. 17/250,889, dated Feb. 29, 2024, 21 pgs.
(Continued)

Primary Examiner — Xiao En Mo
(74) Attorney, Agent, or Firm — MASCHOFF BRENNAN

(57) ABSTRACT

Disclosed embodiments relate to a convolutional neural network computing method and system based on weight kneading, comprising: arranging original weights in a computation sequence and aligning by bit to obtain a weight matrix, removing slack bits in the weight matrix, allowing essential bits in each column of the weight matrix to fill the vacancies according to the computation sequence to obtain an intermediate matrix, removing null rows in the intermediate matrix, obtain a kneading matrix, wherein each row of the kneading matrix serves as a kneading weight; obtaining positional information of the activation corresponding to
(Continued)

| Models | Zero Weights (%) | Zero BITs in Weights (%) |
|---|---|---|
| AlexNet | 0.093 | 70.52 |
| GoogleNet | 0.050 | 65.23 |
| VGG-16 | 0.156 | 70.52 |
| VGG-19 | 0.182 | 71.09 |
| NiN | 0.193 | 67.02 |
| GeoMean | 0.135 | 68.88 | each bit of the kneading weight; divides the kneading weight by bit into multiple weight segments, processing summation of the weight segments and the corresponding activations according to the positional information, and sending a processing result to an adder tree to obtain an output feature map by means of executing shift-and-add on the processing result.

10 Claims, 3 Drawing Sheets

(51) Int. Cl.
  *G06F 7/50* (2006.01)
  *G06F 7/544* (2006.01)
  *G06F 17/16* (2006.01)
  *G06N 3/04* (2023.01)
  *G06N 3/063* (2023.01)
  *H03M 7/40* (2006.01)

(52) U.S. Cl.
  CPC ............... *G06F 17/16* (2013.01); *G06N 3/04* (2013.01); *G06N 3/063* (2013.01); *H03M 7/40* (2013.01); *G06F 2207/386* (2013.01)

(58) Field of Classification Search
  CPC . G06F 5/01; G06F 7/50; G06F 7/5443; G06F 17/16; G06F 2207/386; G06F 17/15; H03M 7/40; H03M 7/3059; H03M 7/70; H03M 7/4037
  See application file for complete search history.

(56) References Cited

OTHER PUBLICATIONS

Delmas, Alberto, et al. "Bit-tactical: Exploiting ineffectual computations in convolutional neural networks: Which, why, and how." arXiv preprint arXiv: 1803.03688 (Mar. 2018). (Year: 2018).

Judd, Patrick, et al. "Stripes: Bit-serial deep neural network computing." 2016 49th Annual IEEE/ACM International Symposium on Microarchitecture (MICRO). IEEE, 2016. (Year: 2016).

International Search report mailed Jul. 30, 2019, in PCT Application No. PCT/CN2019/087767.

Y. Chen, T. Luo, S. Liu, S. Zhang, L. He, J. Wang, et al., "DaDianNao: A Machine-Learning Supercomputer," presented at the Proceedings of the 47th Annual IEEE/ACM International Symposium on Microarchitecture, Cambridge, United Kingdom, 2014.

J. Albericio, A. Delm, P. Judd, S. Sharify, G. O'Leary, et al., "Bit-pragmatic deep neural network computing," presented at the Proceedings of the 50th Annual IEEE/ACM International Symposium on Microarchitecture, Cambridge, Massachusetts, 2017.

* cited by examiner

| Models | Zero Weights (%) | Zero BITs in Weights (%) |
|---|---|---|
| AlexNet | 0.093 | 70.52 |
| GoogleNet | 0.050 | 65.23 |
| VGG-16 | 0.156 | 70.52 |
| VGG-19 | 0.182 | 71.09 |
| NiN | 0.193 | 67.02 |
| GeoMean | 0.135 | 68.88 |
FIG. 1
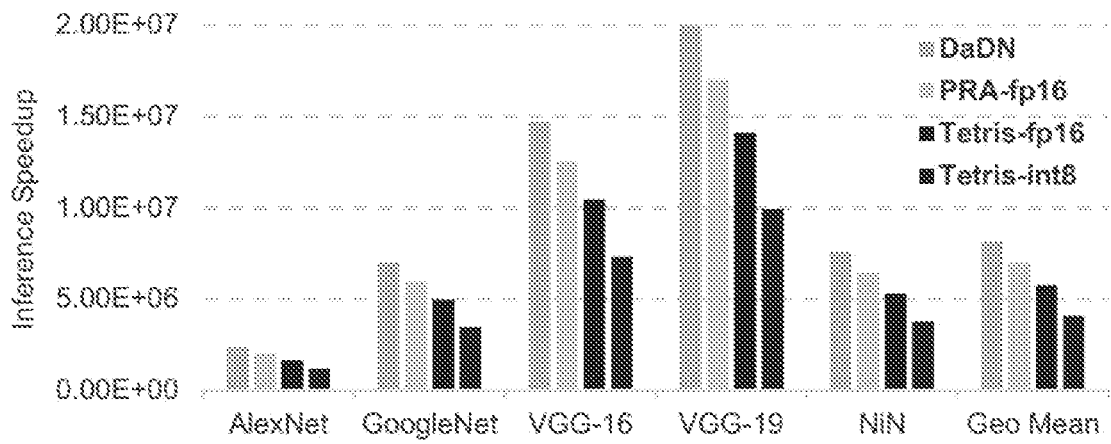
FIG. 2
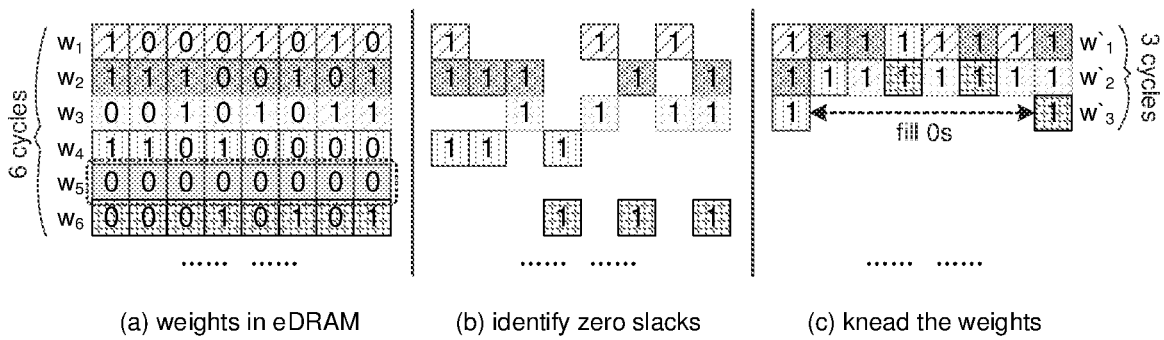
(a) weights in eDRAM  (b) identify zero slacks  (c) knead the weights
FIG. 3

CONVOLUTIONAL NEURAL NETWORK COMPUTING METHOD AND SYSTEM BASED ON WEIGHT KNEADING

CROSS REFERENCE TO RELATED APPLICATIONS

This application is a national application of PCT/CN2019/087767, filed on May 21, 2019. The contents of PCT/CN2019/087767 are all hereby incorporated by reference.

BACKGROUND OF THE INVENTION

1. Field of the Invention

The invention relates to the field of neural network computation, and particularly to a convolutional neural network computing method and system based on weight kneading.

2. Related Art

A deep convolutional neural network has achieved a significant progress in application of machine learning, for example, real-time image recognition, detection and natural language processing. In order to improve accuracy, architecture of the advanced deep convolutional neural network (DCNN) owns a complex connection and massive neurons and synapses to satisfy requirement for high accurate and complex tasks. In a convolution operation, weights are multiplied by corresponding activations, and finally, products are added up to perform a summation. That is, the weight and the activation form a pair.

Considering of limitation of architecture of the traditional general-purpose processor, many researchers propose a specialized accelerator for a specific computing mode of the modern DCNN. The DCNN is formed of multiple layers, from dozens of layers to hundreds of layers, even thousands of layers. In the entire DCNN, nearly 98% of computation comes from the convolution operation. Convolution is the major factor that affects power and performance. In the case of not damaging robustness of a learning model, improving computing efficiency of convolution becomes an efficient method for accelerating the DCNN, in particular, on light-weight devices (e.g., smartphones and automatic robots) with limited resources and low consumption requirements.

To solve the challenge, some existing methods propose use of bit-level series when MAC is executed using characteristic that fixed-point multiplication can be decomposed into a series of single-bit multiplications and shift-and-add. However, an essential bit (or 1) may be at any position of a fixed-point number, so the solution must consider position of the bit "1" in the worst case, and if it is a 16-bit fixed-point number (fp16), a 16-bit register shall be used to save positional information of the essential bit ("1"). Different weights or activations may produce different latency time in the process of acceleration, so unexpectable cycles are produced. Design of hardware necessarily covers the worse case, and only if the cycle of the worse case functions as a cycle of the accelerator, a processing cycle is increased, and a frequency of the accelerator is reduced while also adding complexity of the design.

To accelerate the operation, the typical DCNN accelerator performs a multiplication and addition operation by deploying a multiplier and an adder on each activation and weight lane. In order to realize balance between acceleration and accuracy, multiplication can be floating-point 32-bit operands, or 16-bit fixed-point numbers and 8-bit integers. As compared to the adder of the fixed-point numbers, the multiplier determines delay of the convolution operation, and time desired by an 8-bit fixed-point two operand multiplier is 3.4 times of that of the adder. Moreover, accuracies desired by different DCNN models are different, and even different layers of the same model have different requirements for accuracy, so the multiplier designed for the convolutional neural network accelerator must cover the worse case.

A main component of the typical DCNN accelerator is a multiply-adder, and the main problem of the multiply-adder is to perform invalid operation. The invalid operation can be expressed in two aspects, and firstly, the operand is a value having many zeros or including most of zero bits. As compared to zero bits, zeros occupy a small part of the weight. These small part of zeros can be easily eliminated through an advanced microarchitecture design or a memory-level compression technique, and function as inputs to avoid use of multiplicators. FIG. 1 shows that as compared to the essential bit (or 1), an average ratio of the zero bits reachs up to 68.9%. Secondly, an intermediate result of the multiplication and addition operation is useless. For example, if y=ab+cd+de, we only need the value of y, while the value of ab is unnecessary. This means that optimization of the zero bits and the multiplication and addition operation assist in computing efficiency, and reduce power consumption.

Many people accelerates computation with quantitative technique. For example, the weight is converted into a two-value, or a more accurate three-value. Therefore, a multiplication operation can be converted into a pure shift or add operation. However, such will necessarily sacrifice accuracy of the result, and in particular, in large data sets, accuracies of these solutions are quite seriously damaged. Therefore, it is quite necessary to invent a high accurate accelerator.

The traditional CNN puts each weight/activation pair in a processing element (PE), and completes the multiplication and addition operation within one cycle. However, it is impossible to avoid computing the zero bits. If we can reduce time of invalid computation, throughput of the PE will be improved. The invention refers the bit including the bit "0" in the PE as a "slack bit".

Distribution of the essential bits (or 1) has two characteristics: (1) each position has a probability of about 50% to 60% to be valid, and it also means that each position has a probability of about 40% to 50% to be slack; (2) most of bits of some weights are slack. For example, the third to fifth positions only have less than 1% of the essential bits. These bits are almost all formed of slack bits, but the multiplier does not distinguish the slack bits from the essential bits when executing the multiplication and addition operation. If efficiency of executing the convolution operation shall be improved, the slack bits must be utilized.

If the slack bits in the preceding weight can be replaced by the essential bits of the subsequent weight, invalid computation can be reduced, and multiple weight/activation pairs are processed within one cycle. When these weights are extruded, a total weight can be compressed to nearly a half of an original volume. In other words, inference time can be reduced by 50%. However, it is quite difficult to realize this object, because it is necessary to modify the current MAC computing mode, and reconstruct hardware architecture to support a new computing mode.

SUMMARY OF THE INVENTION

In order to solve the technical problems, an object of the invention is to provide an efficient convolution operational method including weight kneading technique for a convolutional neural network accelerator. Weight kneading improves zero slacks commonly existing in the modern DCNN model, and differs from data compression or trimming in reducing the number of weights without loss of accuracy.

Specifically, the invention discloses a convolutional neural network computing system based on weight kneading, comprising:
  a weight kneading module for acquiring multiple groups of activations to be operated and corresponding original weights, arranging the original weights in a computation sequence and aligning by bit to obtain a weight matrix, removing slack bits in the weight matrix to obtain a reduced matrix with vacancies, allowing essential bits in each column of the reduced matrix to fill the vacancies according to the computation sequence to obtain an intermediate matrix, removing null rows in the intermediate matrix, and placing zeros at vacancies of the intermediate matrix to obtain a kneading matrix, wherein each row of the kneading matrix serves as a kneading weight; and
  a split accumulation module for obtaining, according to a correspondence relationship between the activations and the essential bits in the original weights, positional information of the activation corresponding to each bit of the kneading weight, sending the kneading weight to a split accumulator, which divides the kneading weight by bit into multiple weight segments, processing summation of the weight segments and the corresponding activations according to the positional information, and sending a processing result to an adder tree to obtain an output feature map by means of executing shift-and-add on the processing result,
  wherein the original weights are 16-bit fixed-point numbers, and the split accumulator comprises splitters for dividing the kneading weight by bit.

The invention further discloses a convolutional neural network computing method based on weight kneading, comprising:
  step 1, acquiring multiple groups of activations to be operated and corresponding original weights, arranging the original weights in a computation sequence and aligning by bit to obtain a weight matrix, removing slack bits in the weight matrix to obtain a reduced matrix with vacancies, allowing essential bits in each column of the reduced matrix to fill the vacancies according to the computation sequence to obtain an intermediate matrix, removing null rows in the intermediate matrix, and placing zeros at vacancies of the intermediate matrix to obtain a kneading matrix, wherein each row of the kneading matrix serves as a kneading weight;
  step 2, obtaining, according to a correspondence relationship between the activations and the essential bits in the original weights, positional information of the activation corresponding to each bit of the kneading weight;
  step 3, sending the kneading weight to a split accumulator, which divides the kneading weight by bit into multiple weight segments, processing summation of the weight segments and the corresponding activations according to the positional information, and sending a processing result to an adder tree to obtain an output feature map by means of executing shift-and-add on the processing result.

Technical progresses of the invention comprise:
1. Reducing storage and accelerating an operational speed can be realized through the method of kneading weights and activations, and the way of analyzing and operating kneading values;
2. Architecture of a Tetris accelerator comprises structure of the SAC and structure of the splitters, and may further accelerate convolution computation.

Executing time is obtained by two methods of Vivado HLS emulation, and FIG. 2 shows inference speedup of two models of DaDN and the Tetris accelerator proposed in the invention. Here, we observe that the Tetris method can accelerate 1.3 times on the fp16, and can accelerate 1.5 times on average in an int8 model through the kneading weights. As compared to PRA, it can accelerate nearly 1.15 times.

BRIEF DESCRIPTION OF THE DRAWINGS

FIG. 1 is ratios of zeros and zero BITs in some modern deep convolutional neural network models.
FIG. 2 is a comparison diagram of technical effects.
FIG. 3 is a schematic diagram of kneading weights.

PREFERABLE EMBODIMENTS OF THE INVENTION

Figure 4:
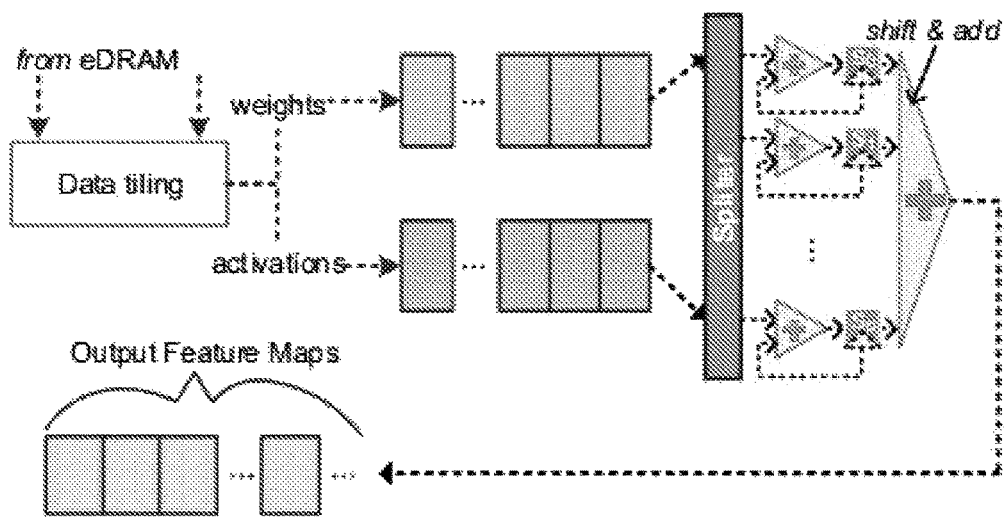
FIG. 4 is a schematic diagram of a split accumulator SAC.

The invention reconstructs an inference and computing mode of the DCNN model. The invention replaces the typical computing mode MAC with a split accumulator (SAC). A series of adders with a low operation cost are replaced without typical multiplication operation. The invention can make full use of essential bits in the weight, and the split accumulator SAC is formed of adders and shifters without multipliers. Each weight/activation pair in the traditional multiplier performs one shift summation operation, where "weight/activation" means "weight and activation". However, the invention performs several accumulations on the multiple weights/activations, but one shift-and-add summation only, thereby acquiring large acceleration.

Finally, the invention proposes a Tetris accelerator to tap the maximum potential of the kneading weight technique and the split accumulator SAC. The Tetris accelerator is formed of a series of split accumulator SAC units, and uses the kneading weights and activations to realize a high throughput and low power consumption inference computation. It is proved by tests of advanced synthesis tools that as compared to the prior art, the Tetris accelerator reaches the best effect. Activation on the first layer is an input, the second activation is an output of the first layer, and so on. If the input is an image, the activation on the first layer is pixel values of the image.

Specifically, the invention comprises:
  step 1, acquiring multiple groups of activations to be operated and corresponding original weights, arranging the original weights in a computation sequence and aligning by bit to obtain a weight matrix, removing slack bits in the weight matrix, i.e., deleting the slack bits to be vacancies, to obtain a reduced matrix with vacancies, allowing essential bits in each column of the reduced matrix to fill the vacancies according to the computation sequence to obtain an intermediate matrix, removing null rows, which are rows where an entire row of the intermediate matrix is vacancies, in the intermediate matrix, and placing zeros at vacancies of the intermediate matrix after removing the null rows to obtain a kneading matrix, wherein each row of the kneading matrix serves as a kneading weight;

step 2, obtaining, according to a correspondence relationship between the activations and the essential bits in the original weights, positional information of the activation corresponding to each bit (element) of the kneading weight;

step 3, sending the kneading weight to a split accumulator, which divides the kneading weight by bit into multiple weight segments, processing summation of the weight segments and the corresponding activations according to the positional information, and sending a processing result to an adder tree to obtain an output feature map by means of executing shift-and-add on the processing result.

The split accumulator comprises splitters for dividing the kneading weight by bit, and segment adders for processing summation of the weight segments and the corresponding activations.

To make the above features and effects of the invention clearer, hereinafter explanations are made in details with reference to examples and the accompanying drawings.

FIG. 3 shows a method for kneading weights. Assuming that six groups of weights are a batch, six cycles are often required to complete a multiplication and addition operation of six pairs of weights/activations. Slacks occur in two orthogonal dimensions: (1) dimensions in the weights, i.e., $W_1$, $W_2$, $W_3$, $W_4$ and $W_6$, where slacks represent arbitrary distribution; (2) slack bits also occur in a weight dimension, i.e., $W_5$, which is an all zero bit (zero) weight, so it does not occur in FIG. 3(b). The essential bits and the slack bits are optimized through kneading, and six computing cycles of the MAC are reduced to three cycles, as shown in FIG. 3(c). The invention acquires $W'_1$, $W'_2$ and $W'_3$ through weight kneading, but each bit is combined by the essential bits of $W_1$ to $W_6$. If more weights are allowed, these slack bits are filled by the essential bits, which is referred to as a "weight kneading" operation in the invention, i.e., replacing the slack bits in the preceding original weight with the essential bits in the subsequent original weight. Obviously, on the one hand, advantage of weight kneading is that it can automatically eliminate influence of zeros without introduction additional operations. On the other hand, the zero bits are also replaced by the essential bits for kneading, avoiding influence of two-dimensional slacks. However, kneading the weights indicates that the current kneading weights shall perform operation with the multiple activations, instead of the separate activation.

In order to support such efficient computation, it is quite important for necessity of exploring architecture of the accelerator, and this architecture is different from the traditional architecture of the typical MAC. We use equivalent shift-and-add to acquire one partial sum, and the partial sum is not completely a sum of multiplication of a series of weights/activations. Therefore, it is unnecessary to shift b bits immediately after one kneading weight w' is computed. The final sum of shifting b bits can be performed after computing the kneading weight, and b is originated according to the principle of shift-and-add. For example, the activation a has four bits, the weight w also has four bits, which are $w_1$, $w_2$, $w_3$ and $w_4$, respectively, and $w_1$ is a high bit, so $a*w=a*w_1*2^3+a*w_2*2^2+a*w_3*2^1+a*w_4*2^0$. Multiplying by $2^3$ is to left shift three bits, multiplying by $2^2$ is to left shift two bits, and multiplying by $2^1$ is to left shift one bit. Therefore, the traditional multiplier has the shift-and-add operation after computing one w*a each time. However, the invention reduces times of shift-and-add, and the processing mode of the invention is different from the traditional MAC and the standard bit sequence method, which is referred to as "SAC" in the invention, where SAC represents "split and accumulation". Firstly, the SAC operation divides the kneading weights, quotes the activations, and finally, accumulates each activation to a specific segment register. FIG. 4 shows SAC processes of each weight/activation pair. As an example of the SAC, the figure only shows its concept, but in practical use, data firstly perform weight kneading, and then are sent to the SAC for computation using the kneading weights in the SAC, and an array consisting of the multiple SACs form an accelerator of the invention.

The split accumulator (SAC) shown in FIG. 4 is different from the MAC, aiming to accurately computing paired multiplication. Firstly, the split accumulator SAC divides the weight, and performs summation of the activation in the corresponding segment adder according to a dividing result. After a certain number of weight/activation pairs are processed, the final shift-and-add operation is executed to obtain the final sum. "A certain number" is obtained from tests, is associated with weight distribution of the convolutional neural network model, can set a good value according to the specific model, and also can select a compromised value suitable for most models. Specifically, the SAC is a split accumulator. After entering, data firstly perform weight kneading, and output of the weight kneading functions as an input of the SAC. The splitters are a part of the SAC, and after entering into the SAC, the weights firstly go through the splitters to analyze the weights (divide the weights), and are distributed to the subsequent segment registers and segment adders. Then, the final result is obtained through an adder tree.

Figures 6, 7:
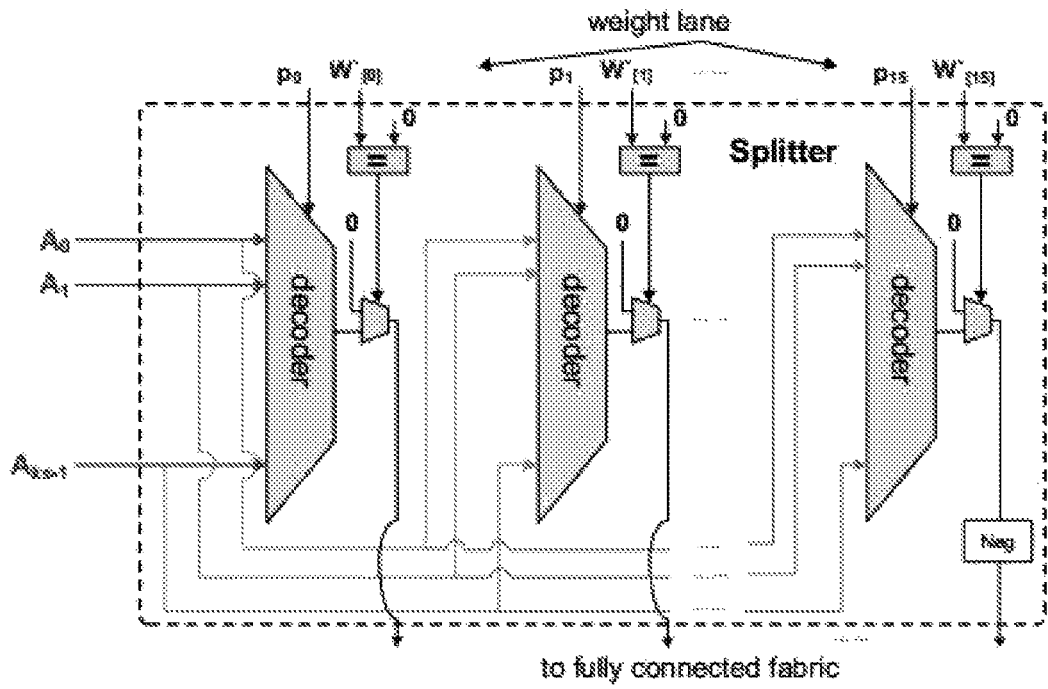
FIG. 6 is a structural diagram of a splitter.
FIG. 7 is a schematic diagram of results saved in registers of an arithmetic unit.

The SAC instantiates "the splitters" according to a desired bit length: if each weight uses a 16-bit fixed-point number, sixteen segment registers (p=16 in the figure) and sixteen adders are needed, and according to requirements for accuracy and speed, the digit of the fixed-point number is determined. The higher the accuracy is, the slower the speed will be, and this selection is determined according to different requirements. Moreover, different models are also different in degree of accuracy sensitivity, some models are fine with eight bits, and some models need sixteen bits. Generally, the splitters are responsible for dispersing each segment into the corresponding adder. For example, if the second bit of the weight is the essential bit, the activation is passed to S1 in the figure. The same operation is also suitable for other bits. After the weight is "split", the subsequent weights are processed in the same way, so each weight segment register accumulates new activations. The subsequent adder tree executes one shift-and-add to obtain the final partial sum. What is different from the MAC is that the SAC does not attempt to obtain an intermediate partial sum. The reason is that output feature maps of the real CNN model only need a "final" sum, i.e., a sum of all lanes of a convolution kernel and corresponding input feature maps. In particular, when the kneading weights are used, the advantage is more obvious than that of the MAC, as shown in FIGS. 3 and 7. When six pairs of weights and activations are computed using the MAC, $a_1*w_1$ shall be firstly computed, then $a_2*w_2$ is computed, and so on, and six multiplication operations are required. However, the SAC needs three cycles, and although the SAC has an operation of reading the positional information of the activations, the operation is performed in the register, and consumes short time far less than one multiplication operation. What is the most time-consuming in the convolution operation is the multiplication operation, and the invention does not have the multiplication operation. Moreover, shift operations are also less than that of the MAC. Although the invention sacrifices quite less additional storage, such sacrifice is worthy.

Figure 5:
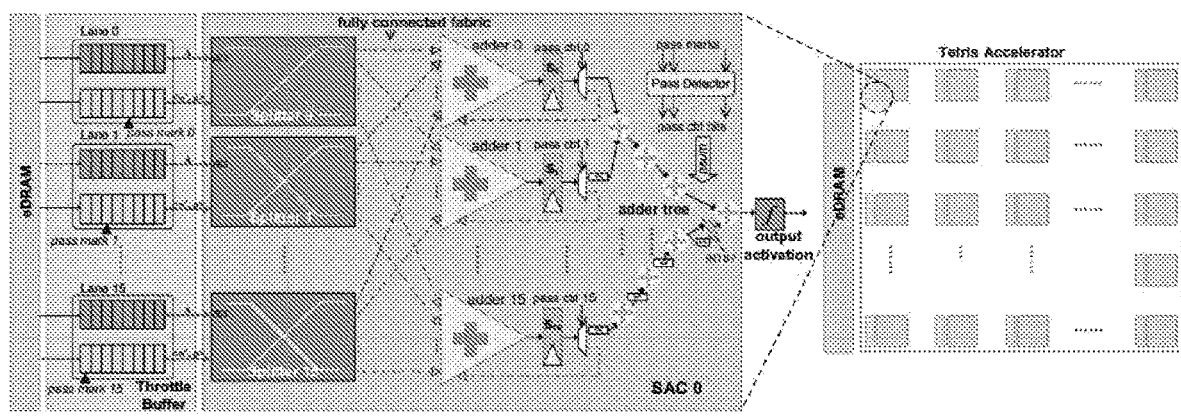
FIG. 5 is an architecture diagram of a Tetris accelerator.

FIG. 5 shows an architecture of a Tetris accelerator. Each SAC unit is formed of sixteen parallel splitters (i.e., FIG. 6), accepts a series of kneading weights and activations, and is expressed by a parameter of kneading stride (KS). The same number of segment adders and the subsequent adder tree are responsible for computing the final partial sum. The tetris refers to that a kneading process in the invention is similar with a stacking process of the tetris.

In design of the traditional accelerator, the paired accumulator cannot improve inference efficiency, because it does not distinguish invalid computation, so even if the current bit of the weight is zero, the paired accumulator still computes the corresponding weight/activation pair. Therefore, in the Tetris accelerator proposed in the invention, the SAC only distributes the activations to the segment adders for accumulation using the kneading weights. FIG. 5 shows an architecture of the tetris. Each SAC unit accepts the weight/activation. Specifically, the accelerator is formed of symmetrical matrixes of the SAC units, connected to a throttle buffer, and accepts the kneading weights from an on-chip eDRAM. If fixed-point 16-bit weights are used, each unit includes sixteen splitters to form a splitter array. The splitters have sixteen output data paths for activation to reach the destination segment register of each splitter according to parameters KS, i.e., KS number of weight kneading, activations and weights, so a fully connected fabric is formed between the splitter array and the segment adders.

A microarchitecture of the splitter is shown in FIG. 6. The weight kneading technique requires that the splitter can accept one group of activations of the kneading weights, and each essential bit must be recognizable to indicate the relevant activations within a range of the KS. The teris method uses <$W_i$, p> in the splitter to express activation associated with the specific essential bit. The KS expresses a range represented by the number of p bits, i.e., four-bit p refers to a kneading stride of sixteen weights. The splitter distributes one comparator to determine whether the bit of kneading weight is zero, because even if after kneading, some positions also may be invalid, i.e., $W'_3$ in FIG. 3(c), depending on the KS. If the bit is slack, a multiplexer after the comparator outputs zero to the subsequent structure. Otherwise, the splitter decodes p, and outputs the corresponding activation.

If necessary, the splitter acquires the target activation in the throttle buffer region without storing the activations several times. The newly introduced positional information p occupies a small part of space, but use of the p is only to decode the activation, and is only formed of several bits, i.e., sixteen activations need four bits, so the splitter does not introduce massive on-chip resources and power cost in the accelerator.

As for each segment adder, it accepts the activations from all sixteen splitters, and adds with values from local segment registers. Summations of intermediate segments are stored in the registers S0 to S15, and once all possible adding tasks are completed, the multiplexer is notified by "a control signal" to pass value of each segment to the subsequent adder tree. The final stage of the adder tree generates a final sum, and the final sum is passed to an output non-linear activation function. The non-linear activation function is determined by network models, such as, RELU and sigmoid. In the throttle buffer unit, ends of possible adding activation/weight pairs are sent to detectors in each SAC unit by identifying them. If all marks reach the ending, the adder tree outputs the final sum. Since we use the KS as the parameter to control the kneading weights, different lanes have different numbers of kneading weights, so in most cases, the marks can reside at any position of the throttle buffer. If the new activation/weight pairs are filled in the buffer region, the marks are shifted backwardly, so computation of partial sum of each segment will not be affected.

Briefly, the weights are firstly stored in the on-chip eDRAM through kneading to acquire kneading weights from the eDRAM, and the weights are analyzed by splitters of the SAC, and distributed to the subsequent segment registers and adders. Then, the final result is obtained through the adder tree. The final result is the feature map, i.e., the input of the next layer.

Each bit of W' may correspond to different A (activations). If the bit is '1', additional cost is required to store which A corresponds to this bit, and if the bit is '0', storing is unnecessary. As for the additionally stored positional information (corresponding to which A), the invention does not limit the coding way, and the common coding way is Huffman coding, for example. The W' and the additionally stored positional information are sent to the SAC, and the SAC sends these weights and activations to corresponding arithmetic unit.

According to kneading the weights in FIG. 3, results in registers of the arithmetic unit are shown in FIG. 7, and then results in the registers are shifted and added to obtain the final result.

Hereinafter system embodiment corresponding to the method embodiment is explained, and this embodiment can be carried out combining with the above embodiment. The relevant technical details mentioned in the above embodiment are still effective in this embodiment, and in order to reduce repetition, the details are not described here. Correspondingly, relevant technical details mentioned in this embodiment also can be applied to the above embodiment.

The invention further discloses a convolutional neural network computing system based on weight kneading, comprising:

a weight kneading module for acquiring multiple groups of activations to be operated and corresponding original weights, arranging the original weights in a computation sequence and aligning by bit to obtain a weight matrix, removing slack bits in the weight matrix to obtain a reduced matrix with vacancies, allowing essential bits in each column of the reduced matrix to fill the vacancies according to the computation sequence to obtain an intermediate matrix, removing null rows in the intermediate matrix, and placing zeros at vacancies of the intermediate matrix to obtain a kneading matrix, wherein each row of the kneading matrix serves as a kneading weight; and a split accumulation module for obtaining, according to a correspondence relationship between the activations and the essential bits in the original weights, positional information of the activation corresponding to each bit of the kneading weight, sending the kneading weight to a split accumulator, which divides the kneading weight by bit into multiple weight segments, processing summation of the weight segments and the corresponding activations according to the positional information, and sending a processing result to an adder tree to obtain an output feature map by means of executing shift-and-add on the processing result, wherein the original weights are 16-bit fixed-point numbers, and the split accumulator comprises splitters for dividing the kneading weight by bit.

In the convolutional neural network computing system based on weight kneading, the split accumulation module comprises saving the positional information of the activation corresponding to each bit of the kneading weight with Huffman coding.

In the convolutional neural network computing system based on weight kneading, the activations are pixel values of an image.

INDUSTRIAL APPLICABILITY

The invention relates to a convolutional neural network computing method and system based on weight kneading, comprising: arranging original weights in a computation sequence and aligning by bit to obtain a weight matrix, removing slack bits in the weight matrix to obtain a reduced matrix with vacancies, allowing essential bits in each column of the reduced matrix to fill the vacancies according to the computation sequence to obtain an intermediate matrix, removing null rows in the intermediate matrix, and placing zeros at vacancies of the intermediate matrix to obtain a kneading matrix, wherein each row of the kneading matrix serves as a kneading weight; obtaining, according to a correspondence relationship between the activations and the essential bits in the original weights, positional information of the activation corresponding to each bit of the kneading weight; sending the kneading weight to a split accumulator, which divides the kneading weight by bit into multiple weight segments, processing summation of the weight segments and the corresponding activations according to the positional information, and sending a processing result to an adder tree to obtain an output feature map by means of executing shift-and-add on the processing result. The invention can reduce storage and accelerate an operational speed of the convolutional neural network through the kneading weights and the activations.

What is claimed is:

1. A convolutional neural network computing system based on weight kneading, comprising:
   a weight kneading module for acquiring multiple groups of activations to be operated and corresponding original weights, arranging the original weights in a computation sequence and aligning by bit to obtain a weight matrix, removing slack bits in the weight matrix to obtain a reduced matrix with vacancies, allowing essential bits in each column of the reduced matrix to fill the vacancies according to the computation sequence to obtain an intermediate matrix, removing null rows in the intermediate matrix, and placing zeros at vacancies of the intermediate matrix to obtain a kneading matrix, wherein each row of the kneading matrix serves as a kneading weight; and
   a split accumulation module for obtaining, according to a correspondence relationship between the activations and the essential bits in the original weights, positional information of the activation corresponding to each bit of the kneading weight, sending the kneading weight to a split accumulator, which divides the kneading weight by bit into multiple weight segments, processing summation of the weight segments and the corresponding activations according to the positional information, and sending a processing result to an adder tree to obtain an output feature map by means of executing shift-and-add on the processing result, wherein the original weights are 16-bit fixed-point numbers, and the split accumulator comprises splitters for dividing the kneading weight by bit.

2. The convolutional neural network computing system based on weight kneading according to claim 1, wherein the split accumulation module comprises saving the positional information of the activation corresponding to each bit of the kneading weight with Huffman coding.

3. The convolutional neural network computing system based on weight kneading according to claim 1, wherein the activations are pixel values of an image.

4. A convolutional neural network computing method based on weight kneading, comprising:
   step 1, acquiring multiple groups of activations to be operated and corresponding original weights, arranging the original weights in a computation sequence and aligning by bit to obtain a weight matrix, removing slack bits in the weight matrix to obtain a reduced matrix with vacancies, allowing essential bits in each column of the reduced matrix to fill the vacancies according to the computation sequence to obtain an intermediate matrix, removing null rows in the intermediate matrix, and placing zeros at vacancies of the intermediate matrix to obtain a kneading matrix, wherein each row of the kneading matrix serves as a kneading weight;
   step 2, obtaining, according to a correspondence relationship between the activations and the essential bits in the original weights, positional information of the activation corresponding to each bit of the kneading weight;
   step 3, sending the kneading weight to a split accumulator, which divides the kneading weight by bit into multiple weight segments, processing summation of the weight segments and the corresponding activations according to the positional information, and sending a processing result to an adder tree to obtain an output feature map by means of executing shift-and-add on the processing result.

5. The convolutional neural network computing method based on weight kneading according to claim 4, wherein the split accumulator in the step 3 comprises splitters for dividing the kneading weight by bit, and segment adders for processing summation of the weight segments and the corresponding activations.

6. The convolutional neural network computing method based on weight kneading according to claim 4, wherein the step 2 comprises saving the positional information of the activation corresponding to each bit of the kneading weight with Huffman coding.

7. The convolutional neural network computing method based on weight kneading according to claim 4, wherein the activations are pixel values of an image.

8. The convolutional neural network computing system based on weight kneading according to claim 2, wherein the activations are pixel values of an image.

9. The convolutional neural network computing method based on weight kneading according to claim 5, wherein the step 2 comprises saving the positional information of the activation corresponding to each bit of the kneading weight with Huffman coding.

10. The convolutional neural network computing method based on weight kneading according to claim 6, wherein the activations are pixel values of an image.

* * * * *